(12) United States Patent
Steffes-Lai et al.

(10) Patent No.: US 9,002,684 B2
(45) Date of Patent: Apr. 7, 2015

(54) APPARATUS AND METHOD FOR PROCESSING A PROCESS SIMULATION DATABASE OF A PROCESS

(71) Applicant: Fraunhofer-Gesellschaft zur Foerderung der angewandten Forschung e.V., Munich (DE)

(72) Inventors: Daniela Steffes-Lai, Cologne (DE); Lialia Nikitina, Hennef (DE); Tanja Clees, Bonn (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 297 days.

(21) Appl. No.: 13/758,152

(22) Filed: Feb. 4, 2013

(65) Prior Publication Data
US 2013/0144578 A1 Jun. 6, 2013

Related U.S. Application Data

(63) Continuation of application No. PCT/EP2010/061450, filed on Aug. 5, 2010.

(51) Int. Cl.
*G06F 7/60* (2006.01)
*G06F 17/10* (2006.01)
*G06G 7/48* (2006.01)
*G06F 17/50* (2006.01)
*G05B 17/02* (2006.01)

(52) U.S. Cl.
CPC ............ *G06F 17/5009* (2013.01); *G05B 17/02* (2013.01)

(58) Field of Classification Search
CPC ..... G06F 17/5009; G05B 17/00; G05B 17/02

USPC .......................................................... 703/2, 6
See application file for complete search history.

(56) References Cited

U.S. PATENT DOCUMENTS 7,330,804 B2 * 2/2008 Turner et al. ...................... 703/2
2003/0130899 A1 * 7/2003 Ferguson et al. ............... 705/26
(Continued)

OTHER PUBLICATIONS

Official Communication issued in International Patent Application No. PCT/EP2010/061450, mailed on May 31, 2011.
(Continued)

*Primary Examiner* — Kandasamy Thangavelu
*Assistant Examiner* — Andre Pierre Louis
(74) *Attorney, Agent, or Firm* — Keating & Bennett, LLP

(57) ABSTRACT

A process simulation database includes process simulation data of a plurality of process simulations based on a different variation of a plurality of process parameters. For each process parameter, for an initial number of different process parameter values, process simulation data of a process simulation are included in the process simulation database. A process parameter classifier calculates a linearity indicator for a varied process parameter based on an analysis of the process simulation database with respect to a linearity of an influence of a variation of at least the varied process parameter on the process simulation data in the process simulation database. Further, a process simulation data processor changes the initial number of different process parameter values of the varied process parameter, for which process simulation data of a process simulation are included in the process simulation database, based on the calculated linearity indicator, to obtain a processed process simulation database.

28 Claims, 7 Drawing Sheets

(56) References Cited

U.S. PATENT DOCUMENTS

2007/0073599 A1* 3/2007 Perry et al. .................. 705/27
2009/0089030 A1 4/2009 Sturrock et al.

OTHER PUBLICATIONS

English translation of Official Communication issued in corresponding International Application PCT/EP2010/061450, mailed on Feb. 14, 2013.

* cited by examiner

APPARATUS AND METHOD FOR PROCESSING A PROCESS SIMULATION DATABASE OF A PROCESS

CROSS-REFERENCE TO RELATED APPLICATIONS

This application is a continuation of copending International Application No. PCT/EP2010/061450, filed Aug. 5, 2010, which is incorporated herein by reference in its entirety.

BACKGROUND OF THE INVENTION

Embodiments of the invention relate to the analysis of process parameter variations of processes and in particular to an apparatus and a method for processing a process simulation database of a process.

The robustness of production processes and the quality of the resulting products can suffer significantly under variations of material, process or geometry parameters as well as external influences. Analyzing the effects of these variations and possibly minimizing the same is a challenging task and an objective in product development. This is in particular the case when entire chains of (production) processes are considered. Incorporating the history of the process into the analysis of the normally exclusively considered last step of the chain can result in significant improvements of the prediction quality. For example in the process chain forming-crash (forming-accident) in the automotive industry, for devices having a potentially critical influence in the crash (accident), such as B pillars consisting of several molded and joined parts, statistical analysis and complete transfer of all local variations across all process steps results in valuable insights and results for product development.

For following variations of process parameters with the help of process simulation data across several process steps, the output data of the process simulation of a process have to be adapted to the prerequisites for input data of the follow-up process. Also, the amount of data has to be kept within a manageable limit. Still, the behavior of the process under the variation of the process parameters is to be mapped as accurately as possible.

SUMMARY

According to an embodiment, an apparatus for processing a process simulation database of a process, including process simulation data of a plurality of process simulations of the process, wherein each process simulation of the plurality of process simulations is based on a different variation of a plurality of process parameters, wherein for each process parameter of the plurality of process parameters, for an initial number of different process parameter values, process simulation data of a process simulation are included in the process simulation database, may have: a process parameter classifier that is implemented to calculate a linearity indicator for a varied process parameter of the plurality of process parameters based on an analysis of the process simulation database with respect to a linearity of an influence of a variation of at least the varied process parameter on the process simulation data in the process simulation database; and a process simulation data processor that is implemented to change the initial number of different process parameter values of the varied process parameter, for which process simulation data of a process simulation are included in the process simulation database, based on the calculated linearity indicator to obtain a processed process simulation database.

According to another embodiment, an apparatus for generating a process simulation database for a process simulation of a follow-up process of a process, for which process simulations are considered, for a different variation of a plurality of process parameters of the process, may have: a process simulator that is implemented to generate process simulation data for the different variations of the plurality of process parameters of the process to obtain a process simulation database of the process; an inventive apparatus for processing a process simulation database of a process as mentioned above that is implemented to process the process simulation database of the process generated by the process simulator; and a process simulation database converter that is implemented to map the processed process simulation database to a simulation grid for process simulation of a follow-up process to generate the process simulation database for the process simulation of the follow-up process, wherein the simulation grid depends on the follow-up process.

According to another embodiment, a method for processing a process simulation database of a process including process simulation data of a plurality of process simulations of the process, wherein each process simulation or the plurality of process simulations is based on a different variation of a plurality of process parameters, wherein, for each process parameter of the plurality of process parameters, for an initial number of different process parameter values, process simulation data of the process simulation are included in the process simulation database, may have the steps of: calculating a linearity indicator for a varied process parameter of the plurality of process parameters, wherein the linearity indicator is calculated based on an analysis of the process simulation database with respect to a linearity of an influence of a variation of at least the varied process parameter on the process simulation data in the process simulation database; and changing the initial number of different process parameter values of the varied process parameter, for which process simulation data of a process simulation are included in the process simulation database, to obtain a processed process simulation database, wherein the initial number of different process parameter values of the varied process parameter is changed based on the calculated linearity indicator.

Another embodiment may have a computer program having a program code for performing the inventive method when the computer program runs on a computer or a microcontroller.

An embodiment according to the invention provides an apparatus for processing a process simulation database of a process comprising a process parameter classifier and a process simulation data processor. Here, the process simulation database of the process comprises process simulation data of a plurality of process simulations of the process, wherein each process simulation of the plurality of process simulations is based on a different variation of a plurality of process parameters. For each varied process parameter of the plurality of varied process parameters, for an initial number of different process parameter values, process simulation data of a process simulation are included in the process simulation database. The process parameter classifier calculates a linearity indicator for a varied process parameter of the plurality of varied process parameters based on an analysis of the process simulation database with respect to a linearity of an influence of a variation of at least the varied process parameters on the process simulation data in the process simulation database. Further, the process simulation data processor changes the initial number of different process parameter values of the varied process parameter, for which process simulation data of a process simulation are included in the process simulation database, based on the calculated linearity indicator to obtain a processed process simulation database.

Embodiments according to the invention are based on the core idea of changing the amount of process simulation data of a varied process parameter in dependence on the behavior of the process simulation data under variation of the considered varied process parameter. For example, the initial number of different process parameter values, for which process simulation data are included in the process simulation database, can be reduced when the considered process parameter has no influence, a negligible influence, a linear influence or a weakly non-linear influence on the process simulation data. In other words, process simulation data belonging to different process parameter values of the considered varied process parameter can be removed from the process simulation database, since the behavior of the process simulation data under variation of the considered process parameter can already be characterized or considered by a few (e.g. one or two) different process parameter values. Thereby, the amount of data in the process simulation database can be significantly reduced. On the other hand, for considered varied process parameters having, for example, a highly non-linear effect on the process simulation data, the number of different process parameter values for which process simulation data are included in the process simulation database, can also be increased to represent the non-linear behavior better. Thereby, the accuracy of considering the variations of the process parameters can be significantly increased.

Some embodiments according to the invention relate to an allocation of a process parameter to a first linearity-dependent class or a second linearity-dependent class of process parameters in dependence on the calculated linearity indicators. Thereby, the parameter can be divided into classes and treated differently according to its influence on the process simulation data (e.g. linear, weakly non-linear, highly non-linear).

Other embodiments according to the invention relate to an allocation of a process parameter to a first influence-dependent class of process parameters and a second influence-dependent class of process parameters based on an influence intensity indicator. Thereby, process parameters having no or only minimum influence on the process simulation data (in the considered variation range of the process parameters) can be differentiated from process parameters having a high influence on the process simulation data. The parameters in the different classes can then be treated differently during the further process.

Several further embodiments according to the invention comprise a process simulator that can simulate the process for a combination of process parameter values for one of the plurality of varied process parameters to obtain process simulation data for this combination. Thereby, for example for highly non-linear process parameters, additional process parameter values can be simulated to map the behavior of the process simulation data with respect to a variation of the process parameter more accurately.

In some embodiments according to the invention, the linearity indicator is based on a Hessian indicating a measure for second-order partial derivative of the process simulation data functional under variation of the process parameters.

BRIEF DESCRIPTION OF THE DRAWINGS

Embodiments of the present invention will be detailed subsequently referring to the appended drawings, in which.

DETAILED DESCRIPTION OF THE INVENTION

In the following, partly, the same reference numbers are used for objects and functional units having the same or similar functional characteristics. Further, optional features of the different embodiments can be combined or inter-exchanged.

Figure 1:
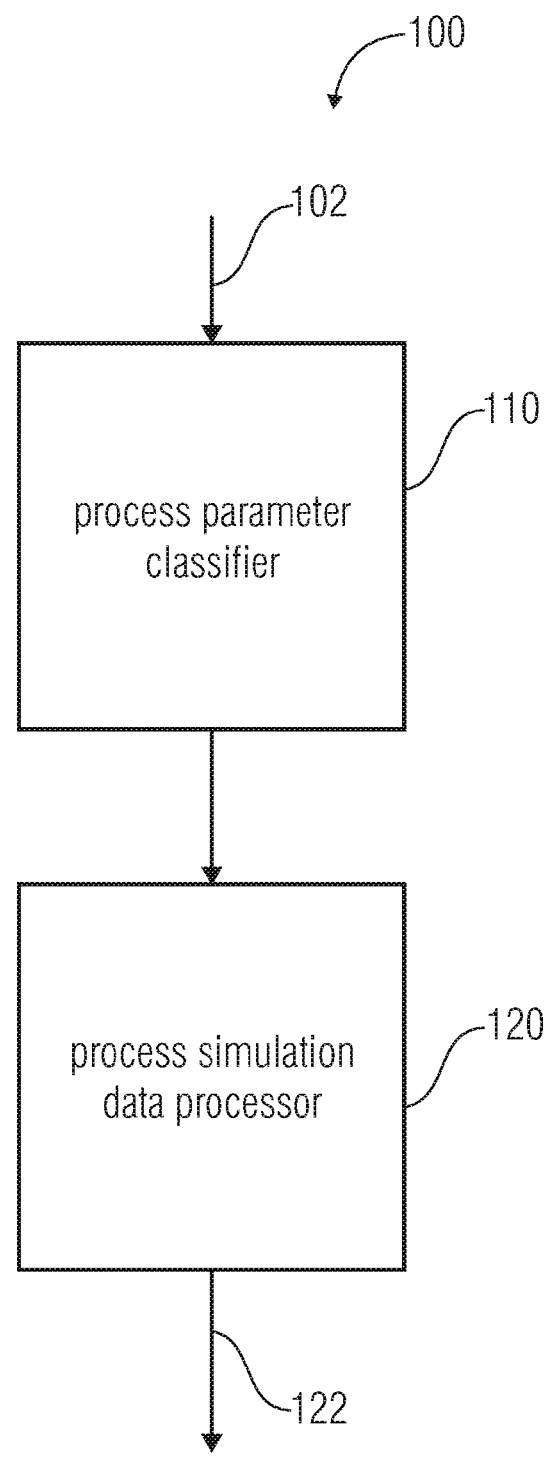
FIG. 1 is a block diagram of an apparatus for processing a process simulation database of a process.

FIG. 1 shows a block diagram of an apparatus 100 for processing a process simulation database 102 of a process according to an embodiment of the invention. The process simulation database 102 of the process comprises process simulation data of a plurality of process simulations of the process, wherein each process simulation of the plurality of process simulations is based on a different variation of a plurality of process parameters. For each process parameter of the plurality of process parameters, for an initial number of different process parameter values, process simulation data of a process simulation are included in the process simulation database 102. The apparatus 100 comprises a process parameter classifier 110 that is connected to a process simulation data processor 120. The process parameter classifier 110 calculates a linearity indicator for a varied process parameter of the plurality of process parameters. The calculation of the linearity indicator is based on an analysis of the process simulation database 102 with respect to a linearity of an influence of a variation of at least the varied process parameter on the process simulation data in the process simulation database 102. Further, the process simulation data processor 120 changes the initial number of different process parameter values of the varied process parameter, for which process simulation data of a process simulation are included in the process simulation database 102 to obtain a processed process simulation database 122. Changing the initial number of different process parameter values is performed based on the calculated linearity indicator. In other words, by changing the initial number of different process parameter values, for which process simulation data are included in the process simulation database 102, process simulation data for further process parameter values of the varied process parameter can be added to the process simulation database 102 or process simulation data of different process parameter values of the varied process parameter can be removed from the process simulation database 102.

By the described concept, the amount of data in the process simulation database 102 can be influenced based on the calculated linearity indicator. By the calculated linearity indicator, for example, it can be determined to what extent the process parameter under variation influences the process simulation data in the process simulation database 102. Accordingly, process parameters can be classified and treated differently. Thereby, on the one hand, the amount of data in the process simulation database 102 can be reduced (e.g. for process parameters having little influence, process parameters having a linear or weakly non-linear influence) or the novelty of considering the process parameters (e.g. for process parameters having a highly non-linear influence) can be increased. By reducing the amount of data in the process simulation database 102, later usage or later processing (e.g. by simulating follow-up process based on the processed process simulation database 122) of the processed process simulation database can be significantly accelerated. In the following, process parameters having no or only little influence on the process simulation data will also be referred to as low-influence process parameters, process parameters having a linear or weakly non-linear influence also as linear or weakly non-linear process parameters, and process parameters having a highly non-linear influence also as highly non-linear process parameters.

The process simulation database 102 of the process is a collection of process simulation data concerning different process parameter values of process parameters which are varied for process simulations. Thereby, for example, the behavior of the process can be examined under variation of the input data determined, among others, by process parameters. Thereby, each process parameter can be varied in an individually determined range. The initial number of different process parameter values of a varied process parameter selected from the respective range of values can be different for all varied process parameters, can be the same for part of the varied process parameters or can be the same for all varied process parameters. The selection of the different process parameter values can be determined, for example, by a design of experiment. In this way, a process simulation database 102 of the process can be generated that can be processed by the inventive apparatus 100 for processing a process simulation database 102 of a process.

Depending on the considered process, a process parameter can represent a plurality of different quantities. In this context, process parameter is a general term for parameters having an influence on a process, such as material parameters (e.g. elasticity module of a material), process parameters (e.g. process temperature), geometry parameters (e.g. shape of the source material) or external influences (e.g. humidity). In a specific example, a process parameter in a forming process can be a contact pressure or a coefficient of friction or a roller, or in a welding process the welding temperature or welding duration.

The inventive concept is basically independent of the considered process and can hence be used for a plurality of processes, such as production processes, manufacturing processes, processing processes, handling processes, conversion processes or forming processes, to mention only a few.

Process simulation can be performed, for example, based on grid models whose shape is changed, for example, during a forming process. The process simulation data as a result of process simulation can specify, for example, the sheet thickness, tension or damage concentration for each grid point. In this context, several process simulation databases 102 can be generated for a process, each including process simulation data for a criterion (functional). For the above-stated example, there would, for example, be a process simulation database for the sheet thickness, a process simulation database for the tensions and a further process simulation database for the damage concentration.

The process simulation database 102 can be illustrated, for example, by a matrix where each column for a process simulation for a specific combination of process parameter values corresponds to the plurality of process parameters and the rows correspond to the grid points of the simulation grid.

The process parameter classifier 110 calculates a linearity indicator for one, several or all varied process parameters of the plurality of process parameters. The linearity indicator is a measure for the linearity of an influence that a considered process parameter has on the respective process simulation data under variation. With this information, the process simulation data processor 120 can adapt, for example, the amount of data in the process simulation database 102 which can be attributed to a variation of the considered process parameter. The process simulation data processor 120 can do this by changing the initial number of different process parameter values of the considered, varied process parameter which are considered in the process simulation database by process simulation data.

The linearity indicator specifies a measure for the linearity of a change of process simulation data under variation of at least the considered varied process parameter, wherein at least the varied process parameter means that the linearity indicator specifies a measure exclusively for the varied process parameter, for several varied process parameters or for all varied process parameters of the plurality of process parameters. The linearity indicator is calculated based on an analysis of the process simulation database 102 with respect to a linearity of an influence of a variation of at least the varied process parameter on the process simulation data in the process simulation database 102. An influence is, for example, linear when the process simulation data (e.g. the sheet thickness) change linearly during a linear variation of the varied process parameter or several of the varied process parameters. A linearity indicator can be defined in many ways, as will be explained below.

In some embodiments according to the invention, the process parameter classifier 110 allocates the varied process parameter to a first linearity-dependent class of process parameters if a calculated linearity indicator of the varied process parameter fulfills a predefined non-linearity criterion. Alternatively, the process parameter classifier 110 allocates the varied process parameter to a second linearity-dependent class of process parameters if the calculated linearity indicator of the varied process parameter does not fulfill the predefined non-linearity criterion. Here, a process parameter allocated to the first linearity-dependent class comprises a stronger non-linear influence on the process simulation data in the process simulation database 102 than a process parameter that is allocated to the second linearity-dependent class. In this way, the process parameter classifier 110 can classify one, several or all process parameters of the plurality of process parameters. This classification can then be considered by the process simulation data processor 120. Generally, a process parameter can also be allocated to one of more than two different linearity-dependent classes. For this, correspondingly, several predefined non-linearity criteria can then be defined.

The predefined non-linearity criterion can be defined in different ways and can also depend on the specific definition of the linearity indicator. By specifying the predefined non-linearity criterion, both the amount of data in the process simulation database and also the accuracy of the consideration of influences of the process parameters can be determined, since the predefined non-linearity criterion can determine from which limit a process parameter is to be considered, for example as highly non-linear, and is to be treated differently by the process simulation data processor 120 than, for example, a process parameter classified as linear or weakly non-linear. The predefined non-linearity criterion can also be referred to as a predefined linearity criterion, since it depends on the definition of the predefined non-linearity criterion (e.g. by an inequality) whether a process parameter has a linear influence on the process simulation data under variation when the process parameter fulfills the predefined non-linearity criterion or not. Also, depending on the definition, the linearity indicator can also be referred to as a non-linearity indicator.

The process simulation data processor 120 can change the initial number of different process parameter values of a considered varied process parameter, for example based on the classification of the process parameters, so that a changed number of different process parameter values of the varied process parameter (for which process simulation data of a process simulation are included in the process simulation database 102) is smaller, when the varied process parameter is allocated to the second linearity-dependent class of process parameters, than a changed number of different process parameter values of the varied process parameter (for which process simulation data of a process simulation are included in the process simulation database 102), when the varied process parameter is allocated to the first linearity-dependent class of process parameters. In other words, a process parameter having, for example, a highly non-linear influence on the process simulation data can be considered with a larger number of process simulation data for different process parameter values than a process parameter having no, a linear or only a weakly non-linear influence on the process simulation data. As a consequence, for example in a process simulation database 102 including a variation of many process parameters having no influence, having a linear influence or a weakly non-linear influence on the process simulation data, the amount of data can be significantly reduced, since for these process parameters only a few different process parameter values can be considered without losing a lot of accuracy. Vice versa, in a process simulation database 102 comprising many process parameters having a highly non-linear influence on the process simulation data, the accuracy of mapping the influence on the process simulation data can be significantly increased by considering, for example, additional different process parameter values for the highly non-linear process parameters.

Additionally, the processor parameter classifier 110 can generally consider the intensity of an influence of the variation of a process parameter on the process simulation data in the process simulation database 102. For this, in some embodiments according to the invention, the process parameter classifier 110 can calculate an influence intensity indicator based on an analysis of the process simulation database with respect to intensity of an influence of a variation of the varied process parameter on the process simulation data in the process simulation database 102. Subsequently, the process parameter classifier 110 can allocate the varied process parameter to a first influence-dependent class of process parameters when the influence intensity indicator fulfills a minimum influence criterion. Alternatively, the process parameter classifier 110 can allocate the varied process parameter to a second influence-dependent class of process parameters when the influence intensity parameter does not fulfill the minimum influence criterion. A process parameter allocated to the first influence-dependent class has a stronger influence on the process simulation data in the process simulation database 102 than a process parameter that is allocated to the second influence-dependent class of process parameters. The classification of the process parameters into influence-dependent classes can be used, for example, by the process simulation data processor 120 to consider process parameters differently in different classes. Generally, a process parameter can also be allocated to one of more than two different influence-dependent classes. To this end, correspondingly, more minimum influence criteria can be defined.

The process simulation data processor 120 can change, for example, the initial number of different process parameter values of the varied process parameter, so that a changed number of different process parameter values of the varied process parameter (for which process simulation data of a process simulation are included in the process simulation database 102) is smaller when the varied process parameter is allocated to the second influence-dependent class of process parameters than a changed number of different process parameter values of the varied process parameter (for which process simulation data of a process simulation are included in the process simulation database 102) when the varied process parameter is allocated to the first influence-dependent class of process parameters. In other words, a process parameter having a small influence on the process simulation data under variation can be considered by a lower number of process simulation data for different process parameter values than a process parameter having a stronger influence on the process simulation data under variation.

The influence intensity indicator can be defined in different ways, as will be shown below. The minimum influence criterion can also be defined in different ways. As described for the predefined non-linearity criterion, determining the minimum influence criterion can also influence to what extent the amount of data in the process simulation database 102 and/or the accuracy of the process simulation data in the process simulation database 102 is influenced under variation of the process parameters.

In some embodiments according to the invention, allocation of a varied process parameter is performed both to linear-dependent classes and to influence-dependent classes. In this case, the process parameter classifier 110 allocates the varied process parameter, for example, at first to the first linearity-dependent class of process parameters or the second linearity-dependent class of process parameters. Subsequently, the process parameter classifier 110 allocates the varied process parameter to the first influence-dependent class of process parameters or the second influence-dependent class of process parameters, when the varied process parameter has been previously allocated to the second linearity-dependent class of process parameters. Thereby, process parameters that have been allocated to the first linearity-dependent class no longer have to be allocated to an influence-dependent class, since a process parameter in the first linearity-dependent class has, for example, a highly non-linear influence on the process simulation data and hence cannot be classified into the second influence-dependent class of process parameters having little or no influence anyway.

After classifying a process parameter into linearity-dependent classes and/or influence-dependent classes, the process simulation data processor 120 can process the process simulation database 102. For example, the process simulation data processor 120 can reduce the initial number of different process parameter values of a considered varied process parameter to two different process parameter values of the varied process parameter (if for this process parameter not exactly two different process parameter values have already been considered), for which process simulation data of a process simulation are included in the process simulation database 102, when the varied process parameter is allocated to the second linearity-dependent class of process parameters and the first influence-dependent class of process parameters. On the other hand, the process simulation data processor 120 can reduce the initial number of different process parameter values of the varied process parameter to a single process parameter value of the varied process parameter, for which process simulation data of a process simulation are included in the process simulation database 102, when the varied process parameter is allocated to the second linearity-dependent class and the second influence-dependent class. In this case, the process parameter is then no longer part of the plurality of varied process parameters, since the process simulation database 102 now includes only process simulation data for one process parameter value of the process parameter and hence no variations of the process parameter are performed any longer.

In other words, for a process parameter having no or only negligible influence on the process simulation data under variation anyway, it can be sufficient to consider process simulation data for a single process parameter value. In contrast, for a process parameter having more than a minimum influence (defined by the minimum influence criterion) but having no highly non-linear (defined by the predefined non-linearity criterion) influence on the process simulation data under variation, it can be sufficient to consider the linear or weakly non-linear behavior by considering process simulation data of two different process parameter values of the considered process parameter.

Figure 4:
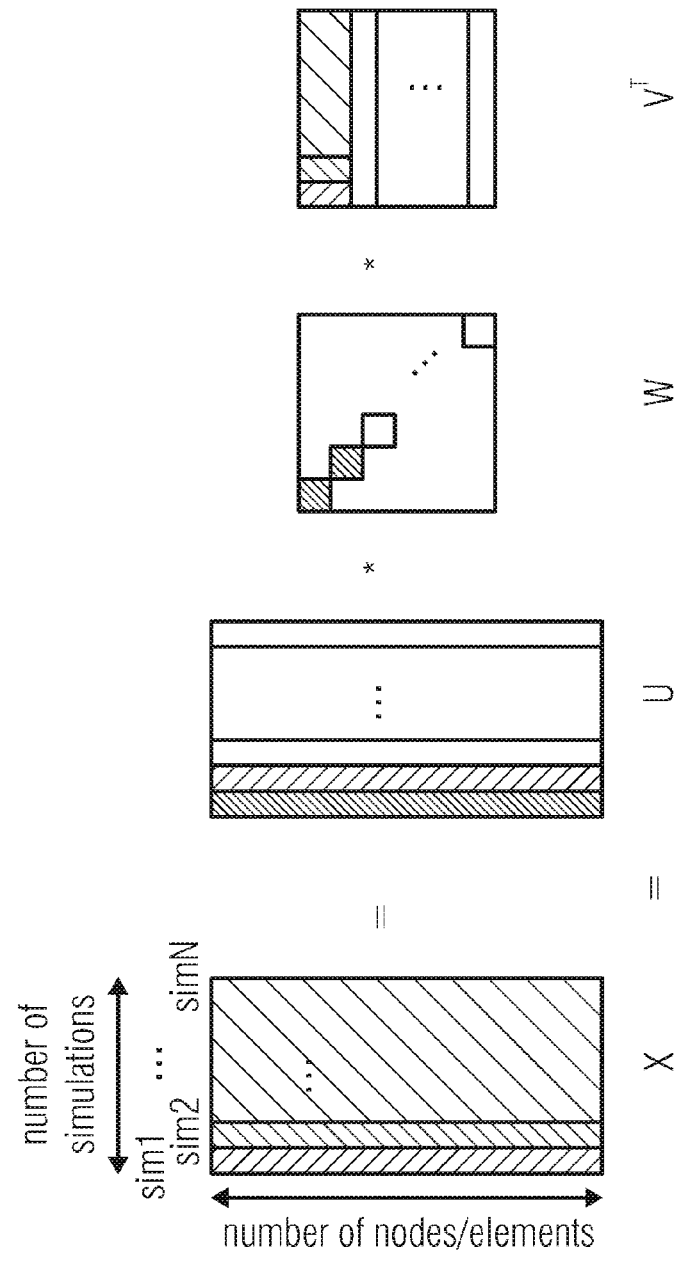
FIG. 4 is a schematic illustration of a singular value decomposition.

As has already been mentioned, the linearity indicator can be defined and calculated in many different ways. The calculation can be performed, for example, on a base transformation of a process simulation data matrix, wherein the process simulation data matrix represents the process simulation database 102. Among other things, calculating the linearity indicator can be performed, for example, based on a singular value decomposition of the process simulation data matrix or a core-based method. A schematic example of singular value decomposition of a process simulation data matrix is shown in FIG. 4. Thereby, matrix X represents the process simulation data matrix which represents the process simulation database. One column of the process simulation data matrix X includes the process simulation data (e.g. sheet thicknesses, tensions or damage densities) of a process simulation for a combination of process parameter values of the plurality of process parameters. One row of the process simulation data matrix X includes, accordingly, the process simulation data of different process simulations for different combinations of process parameter values for a process simulation data element (e.g. the sheet thickness at a point of a simulation grid). This process simulation data matrix X can be decomposed into three matrices U, W, V by the singular value decomposition, e.g.

$$X = UWV^T.$$

The matrix U includes in its rows, like the matrix X, the different process simulation data elements, and the first column represents an average value of the same across the process simulations. The second column includes a first-order derivative from this average value, the third column a second-order derivative, etc. The matrix U has the same number of rows as matrix X, which corresponds to the number of process simulation data elements (e.g. number of grid points of a simulation grid) of the process simulation database. Likewise, matrix U comprises a number of columns corresponding to the number of columns of matrix X, which is equal to the number process simulations of the plurality of process simulations. Matrix W is a diagonal matrix and has weighting factors in its diagonal in descending order. Matrix W has a number of rows and columns corresponding to the number of process simulations. In one column, matrix $V^T$ has weighting factors for the average value and its derivatives of the matrix U and each row includes a weighting factor for the different process simulations. The process simulation data elements can also be called nodes or generally elements.

In some embodiments according to the invention, the linearity indicator of a considered varying process parameter can be calculated based on a Hessian. Here, the Hessian indicates a measure for the second-order partial derivative of the process simulation data under variation of the plurality of process parameters. Here, the Hessian can be calculated, for example, based on a unitary matrix (e.g. matrix V) of the singular value decomposition of the process simulation data matrix X.

In this example, it is also possible to reduce the unitary matrix by neglecting rows. The reduction can be determined by neglecting diagonal elements of the diagonal matrix W of the singular value decomposition. The diagonal elements of the diagonal matrix W are sorted in descending order. Correspondingly, the diagonal elements have less influence on the overall result. Thus, in dependence on an accuracy criterion, diagonal elements can be removed or set to zero, whereby correspondingly rows of unitary matrix $V^T$ and columns of matrix U are no longer considered.

Additionally, the process parameter classifier 110 can calculate a Jacobian matrix which indicates a measure for the first derivative of the process simulation data under variation of the plurality of process parameters. Following this, the process simulation data processor 120 can allocate a considered varied process parameter, based on a comparison of a comparison parameter based on the Jacobian matrix with the linearity indicator based on the Hessian, to the first linearity-dependent class of process parameters or to the second linearity-dependent class of parameters. In other words, by comparing a measure for a first-order variation of the process simulation data with a measure for the second-order variation of the process simulation data, a considered varied process parameter can be classified.

For example, the linearity indicator can be calculated based on a maximum eigenvalue of the Hessian and can be compared to a comparison parameter based on the Jacobian matrix, whereby it can be simultaneously detected whether all process parameters of the plurality of process parameters do not fulfill a predefined non-linearity criterion (or fulfill the same, depending on the definition of the linearity indicator and the non-linearity criterion). Accordingly, all process parameters of the plurality of process parameters can be allocated to the second linearity-dependent class of process parameters. In other words, the maximum eigenvalue of the Hessian reflects a measure of the linear or non-linear behavior of all varied process parameters, whereby by a comparison with the comparison parameter based on the Jacobian matrix all process parameters can be classified at once if the non-linearity criterion is not fulfilled. If the non-linearity criterion is fulfilled, at least one of the process parameters of the plurality of process parameters has a highly non-linear influence on the process simulation data under variation with respect to the predefined non-linearity criterion. Thus, possibly, classification of all process parameters can be performed already at this point without considering each process parameter individually. The linearity indicator can, for example, be the eigenvalue itself, a weighted eigenvalue or another value depending in another way on the eigenvalue in a deterministic manner. This also applies generally below when a linearity indicator is based on an eigenvalue.

For extracting at least one non-linear process parameter from the subset, for example a base transformation can be performed in a base region comprising eigenvectors that each only depend on one of the process parameters of the subset of process parameters. There, the eigenvectors can be calculated with allocated eigenvalues, and the eigenvalues can again be used for calculating linearity indicators. The linearity indicators can then each be compared to a comparison parameter based on the Jacobian matrix. Thereby, one or several eigenvalues can be determined, for which a non-linearity criterion is fulfilled, and the associated process parameters can be allocated to the first linearity-dependent class. In other words, the process parameter classifier 110 can calculate, for each process parameter of the subset of varied process parameters, an eigenvector with associated eigenvalue, so that each eigenvector depends in each case only on one respective process parameter of the subset of varied process parameters and is independent of the other process parameters of the subset of process parameters. Further, the process parameter classifier 110 calculates, for each eigenvalue of the eigenvectors, a linearity indicator based on the respective eigenvalue and compares the same with a comparison parameter based on the Jacobian matrix to determine an eigenvalue for which a non-linearity criterion is fulfilled and to allocate the associated process parameter to the first linearity-dependent class of process parameters.

Alternatively, for example, for the Hessians, only the diagonal elements can be calculated and, based on the diagonal elements, linearity indicators can be calculated directly for the respective process parameters to allow individual classification of the process parameters of the plurality of process parameters.

In the following, specific examples are shown for linearity indicators and a non-linearity criterion, which are performed based on singular value decomposition of a process simulation data matrix, a Hessian and a Jacobian matrix.

More specifically, for example, approximations are calculated for the Jacobian matrix J and the Hessian H, $$J_{IK} = \frac{\partial x_1}{\partial par_k}$$

$$H_{jk}^{(i)} = \frac{\partial^2 x_1}{(\partial par_j \partial par_k)}.$$

Here, for example, the result of the base transformation can be used directly, in the case of singular value decomposition, coefficients in V are considered. Here, the index i stands for a row of the matrix V and the indices j and k for a process parameter of the plurality of varied process parameters.

The following measure can be used as estimator for the degree of non-linearity, if the Hessian is zero or approximately zero, the behavior can be considered as linear or weakly non-linear. If, for example, $$J^{(i)} < \frac{D}{4} H_{max}^{(i)},$$

applies, the behavior is to be considered as non-linear. The stated inequality is an example for a predefined non-linearity criterion. The predefined non-linearity criterion can be examined for each row i. However, it can be sufficient to examine the predefined non-linearity criterion for only one row (e.g. advantageously for the row having the largest influence in singular value decomposition). Here $$J^{(i)} = \sqrt{\sum_j J_{ij}^2},$$

D is the diameter of the region where the process parameters have been varied (e.g. represented by the size of the range of values in which the process parameter having the largest range of values varies or an average value of the ranges of values of all process parameters of the plurality of process parameters) and $H_{max}^{(i)}$ is the maximum absolute eigenvalue of $H_{jk}^{(i)}$. $J^{(i)}$ then represents the comparison parameter depending on the Jacobian matrix and D/4 $H_{max}^{(i)}$ the linearity indicator. By means of a sensitivity analysis (calculating an influence intensity indicator), those parameters can be determined whose variations show no effects relevant for the user and hence do not have to be examined any further.

The dependence on the parameters is implicitly in the formulas.

In other words, if only one parameter exists, $J_{i1}$ and $H_{11}^{(i)}$ are calculated.

If several parameters exist and only one is to be considered, $J_{i1}$ specifies the first derivative with respect to this parameter and $H_{11}^{(i)}$ the $2^{nd}$ derivative with respect to this parameter and $H_{j1}^{(i)}$ the $2^{nd}$ derivative with respect to this and several other parameters. If $$J^{(i)} < \frac{D}{4} H_{max}^{(i)}$$

applies, the behavior is non-linear.

This criterion considers the eigenvalues of the entire Hessian, i.e. independent of a specific parameter.

If only one parameter exists, $H^{(i)}\_max$ is equal to $|H_{11}^{(i)}|$. When several parameters exist, all elements of $H_{jk}^{(i)}$ are considered, wherein jk belongs to the parameters and I is the row (i.e. the criterion. Remember: row of V corresponds to column of U, this is the average value and derivatives therefrom).

Thus, by this criterion (predefined non-linearity criterion), in a parameter, the maximum absolute value of the linear part of the derivative is compared with the maximum absolute value of the square part when all parameters have been varied in one sphere having the diameter D.

When, for example, one parameter is considered, comparison can be made entry by entry per parameter, with several parameters, the entire behavior can be judged by criterion.

Again in other words, as an estimator for the degree of non-linearity, the following measure can be used, when the Hessian is zero or almost zero, the behavior is to be considered as linear or weakly non-linear. If $$J^{(i)} > \frac{D}{4} H_{max}^{(i)}$$

applies, the behavior of all parameters can be considered to be linear.

If $$J^{(i)} < \frac{D}{4} H_{max}^{(i)}$$

applies, the behavior all in all is to be considered to be non-linear, i.e. there are parameters that have a non-linear effect. Now, it is determined which parameter (combinations) have a non-linear effect.

For this, for example, all eigenvalues $\lambda_1$ of the Hessian $H^{(i)}$ can be calculated.

When $$J^{(i)} < \frac{D}{4}\lambda_1$$

applies (corresponding to an example of a predefined non-linearity criterion), then the linear combination of the parameters determined by the associated eigenvector belonging to $\lambda_1$ has a non-linear effect. All parameters occurring in this combination can already be treated as non-linear. For differentiating the parameters further, an eigenvector can be selected corresponding only to one parameter and setting all other parameters to zero. If the associated eigenvalue $\lambda_1$ fulfills the inequality $$J^{(i)} < \frac{D}{4}\lambda_1,$$

this parameter shows non-linear influence. $J^{(i)}$ then represents the comparison parameter depending on the Jacobian matrix and $D/4\,\lambda_1$ the linearity indicator.

By means of a sensitivity analysis, e.g. based on a relative comparison of the columns of the Jacobian matrix among one another, furthermore those parameters can be determined whose variations show no relevant effects for the user and hence do not have to be examined further.

The described example allow, for example, simultaneous construction and compression of the database, e.g. by means of singular value decomposition.

In some embodiments according to the invention, a Jacobian matrix is calculated to allow classification of process parameters with respect to the intensity of their influence on the process simulation data under variation of the process parameters. To this end, for example, the process parameter classifier 110 calculates a Jacobian matrix indicating a measure for the first derivative of the process simulation data under variation of the plurality of process parameters. Further, based on a comparison of the influence intensity indicator with a comparison parameter based on a column of the Jacobian matrix, the process parameter classifier 110 allocates a considered varied process parameter to the first influence-dependent class of process parameters or the second influence-dependent class of process parameters. The process parameter classifier 110 calculates the influence intensity indicator based on a column of the Jacobian matrix indicating a measure for the first derivative of process simulation data under variation of the varied process parameters. In other words, since the columns of the Jacobian matrix indicate a measure for the variation of the process simulation data under variation of the respective process parameters, it can be determined, by comparing the columns among each other, which parameters have a strong effect compared to others and which have little or no effect at all.

For example, the influence intensity indicator of a varied process parameter k can be an element of the associated column k of the Jacobian matrix, an average value across the elements of the associated column k of the Jacobian matrix of a sum of the elements of the associated column k of the Jacobian matrix. Then, the influence intensity indicator can be compared with an equivalent value of another column m belonging to another process parameter. If the influence intensity indicator of the varied process parameter k is, for example, less than half, a fifth, a tenth of or even less than the respective value of another process parameter m (which corresponds to an example for a minimum influence criterion), the considered process parameter can be considered as a process parameter having no or negligible influence on the process simulation data (in the considered variation range of the process parameter), which is equivalent to an allocation to the second influence-dependent class. Examples for minimum influence criteria are:

$$J_{ik} < \frac{1}{10}J_{im} \text{ or } \sum_i J_{ik} < \frac{1}{10}\sum_i J_{im}$$

Vice versa, the influence intensity indicator of a process parameter k is two times, five times, ten times or even more times the respective value of another process parameter m, so the same can be considered as having a strong influence corresponding to an allocation to the first influence-dependent class.

Generally, regarding the above statements and also the following statements, it can be said that the same result can be obtained, when columns and rows are exchanged partly or in all matrices (e.g. X, U, W, $V^T$, J, H).

Classification of the process parameters can be performed for each process parameter of the plurality of varied process parameters. For this, the process parameter classifier 110 can calculate a linearity indicator and/or an influence intensity indicator for each process parameter of the plurality of process parameters.

Figure 2:
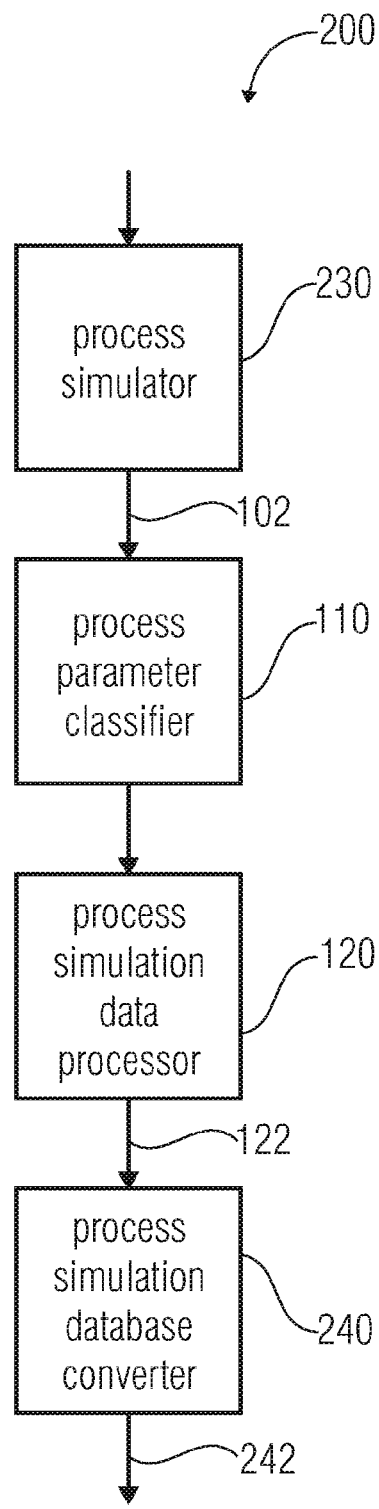
FIG. 2 is a block diagram of an apparatus for processing a process simulation database of a process.

FIG. 2 shows a block diagram of an apparatus for processing a process simulation database of a process according to an embodiment of the invention. The apparatus 200 is similar to the apparatus shown in FIG. 1, but comprises, additionally, a process simulator 230 and/or a process simulation database converter 240. The process simulator 230 and the process simulation database converter 240 are optional units which can both be implemented individually or together. The optional process simulator 230 is connected to the process parameter classifier 110, and the process simulation data processor 120 is connected to the optional process simulation database converter 240.

The process simulator 230 can, for example, be used to generate the process simulation data of the process simulation database 102 for the different variations of the plurality of process parameters. The plurality of process parameters can be varied, for example, based on a design of experiment. In other words, the process simulator 230 can be used to establish the initial process simulation database of the process. Independent thereof, the process simulator 230 can also be used only or additionally for generating further process simulation data.

The process simulator 230 can simulate the process for a combination of process parameter values of the plurality of process parameters to obtain process simulation data for the combination of process parameter value and to add the same to the process simulation database 102. Thereby, the process simulation database can be expanded, for example to improve the accuracy of the representation of the behavior of the process simulation data under variation of the process parameters.

For example, the process simulation data processor 120 can determine two different process parameter values for a considered varied process parameter. For the two determined process parameter values of the considered varied process parameter, the process simulator 230 can generate new process simulation data in combination with a variation of the residual process parameters of the plurality of process parameters, and replace the old process simulation data in the process simulation database 102 by the new process simulation data when the considered varied process parameter is allocated to the second linearity-dependent class of process parameters and to the first influence-dependent class of process parameters. In other words, if a process parameter is classified as influential with a linear or slightly non-linear influence on the process simulation data, it can be sufficient to consider two different process parameter values for this process parameter for which process simulation data are contained in the process simulation database 102.

On the other hand, the process simulation data processor 120 can determine at least three process parameter values for the considered varied process parameter when the process parameter is allocated to the first linearity-dependent class. In other words, for a process parameter having a highly non-linear influence on the process simulation data, more than two different process parameter values, for which process simulation data are included in the process simulation database, can be considered to represent the behavior with sufficient accuracy. The more different process parameter values are considered for the considered varied process parameter, the more accurate the process simulation data reflect the behavior with respect to a variation of this process parameter. The process simulation data processor 120 can determine process parameter values that are already contained in the initial number of process parameter values of the considered varied process parameter or can determine new process parameter values for the varied process parameter, for example, based on an interpolation or approximation.

If at least one determined process parameter value of the considered varied process parameter is not already included in the initial number of process parameter values of the varied process parameter, the process simulator 230 can, for all process parameter values determined by the process simulation data processor 120 that are not included in the initial number of process parameter values of the varied process parameter, in combination with a variation of the residual process parameters of the plurality of varied process parameters, generate new process simulation data and add them to the process simulation database 102. Optionally, the process simulation data processor 120 can remove process simulation data of process parameter values, which have not been determined by the process simulation data processor 120, from the process simulation database. Thereby, a reproduction of the behavior of the process simulation data under variation of the non-linear process parameters by the process simulation database that is as accurate as possible can be obtained with as few process simulation data of process parameter values of the considered non-linear process parameter as possible.

The process simulation data processor 120 can interpolate or approximate the results (functionals, data) for a (new) considered varied process parameter value or a (new) plurality of process parameter values, for example based on a meta modeling method, a response area modeling method, a (non-linear) regression method, radial basis functions, a Kriging method, a wavelet method, self-organizing maps, support vector machines or neural networks.

In addition, the process simulation data processor 120 can interpolate or approximate (by the above-stated methods) additional functionals, which are, for example, derived functionals of the original functionals, such as statistical quantities, e.g. variance, for a (new) considered varied process parameter value or a (new) plurality of process parameter values.

The optional process simulation database converter 240 can, for example, transfer or map the processed process simulation database 122 to a simulator grid for process simulation of a follow-up process, to obtain a converted process simulation database 242 for the follow-up process, wherein the simulation grid depends on the follow-up process. In many cases, simulation grids, on which the process simulations for individual processes are based, differ. In order to make the variations of the plurality of process parameters considered in the processed process simulation database 122 usable for the process simulation of a follow-up process, this revised process simulation database can be transferred to a simulation grid of the follow-up process. Thereby, variations of process parameters can be followed across entire process chains. For example, process simulation data obtained during the production of a car for the individual parts of the car can be transferred to a simulation grid for a crash test. The simulation grid of the crash test has normally significantly less grid points per member than are used for each member during member production simulation. This problem can be solved by the described mapping.

The process simulation database converter 240 can calculate, for example, a quality parameter. The quality parameter is a measure for an error of the transfer of the processed process simulation database to the simulation grid of the process simulation of the follow-up process. Additionally, the process simulation database converter 240 can transfer the processed process simulation database 122, such that the quality parameter is smaller than a maximum variation of process simulation data in the process simulation data in the processed process simulation database 122 under variation of the plurality of process parameters.

The apparatus 200 shown in FIG. 2 for processing a process simulation database of a process can also be seen, for example, as an apparatus for generating a process simulation database for a process simulation of a follow-up process, wherein the follow-up process follows a process for which process simulations have been considered for a different variation of a plurality of process parameters of the process. The apparatus includes a process simulator 230 of an apparatus for processing a process simulation database 102 of a process, as shown, for example, in FIG. 1, and a process simulation database converter 240. The process simulator 230 generates process simulation data for the different variations of the plurality of process parameters of the process to obtain a process simulation database 102 of the process. The process simulation database 102 of the process generated by the process simulator 230 is then processed by the apparatus for processing a process simulation database of a process. Then, the process simulation database converter 240 transfers the processed process simulation database 122 to a simulation grid for the process simulation of the follow-up process to generate the process simulation database 242 for the process simulation of the follow-up process, wherein the simulation grid depends on the follow-up process.

Figure 3:
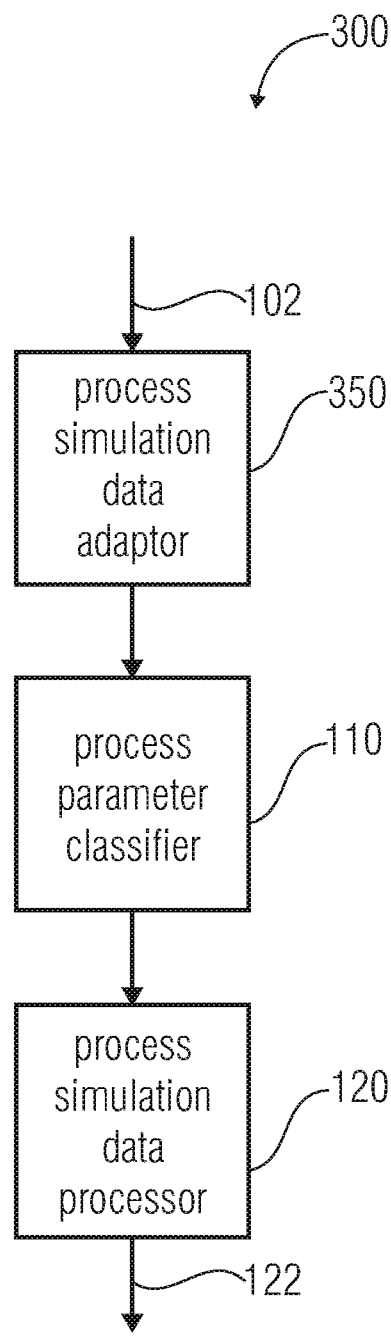
FIG. 3 is a block diagram of an apparatus for processing a process simulation database of a process.

FIG. 3 shows a block diagram of an apparatus 300 for processing a process simulation database of a process according to an embodiment of the invention. The apparatus 300 is similar to the apparatus shown in FIG. 1, but additionally includes a process simulation data adapter 350. The process simulation data adapter 350 is connected to the process parameter classifier 110. The process simulation data adapter 350 transfers process simulation data of different process simulations of the plurality of process simulations that are based on different simulation grids to a common reference grid.

Figure 5:
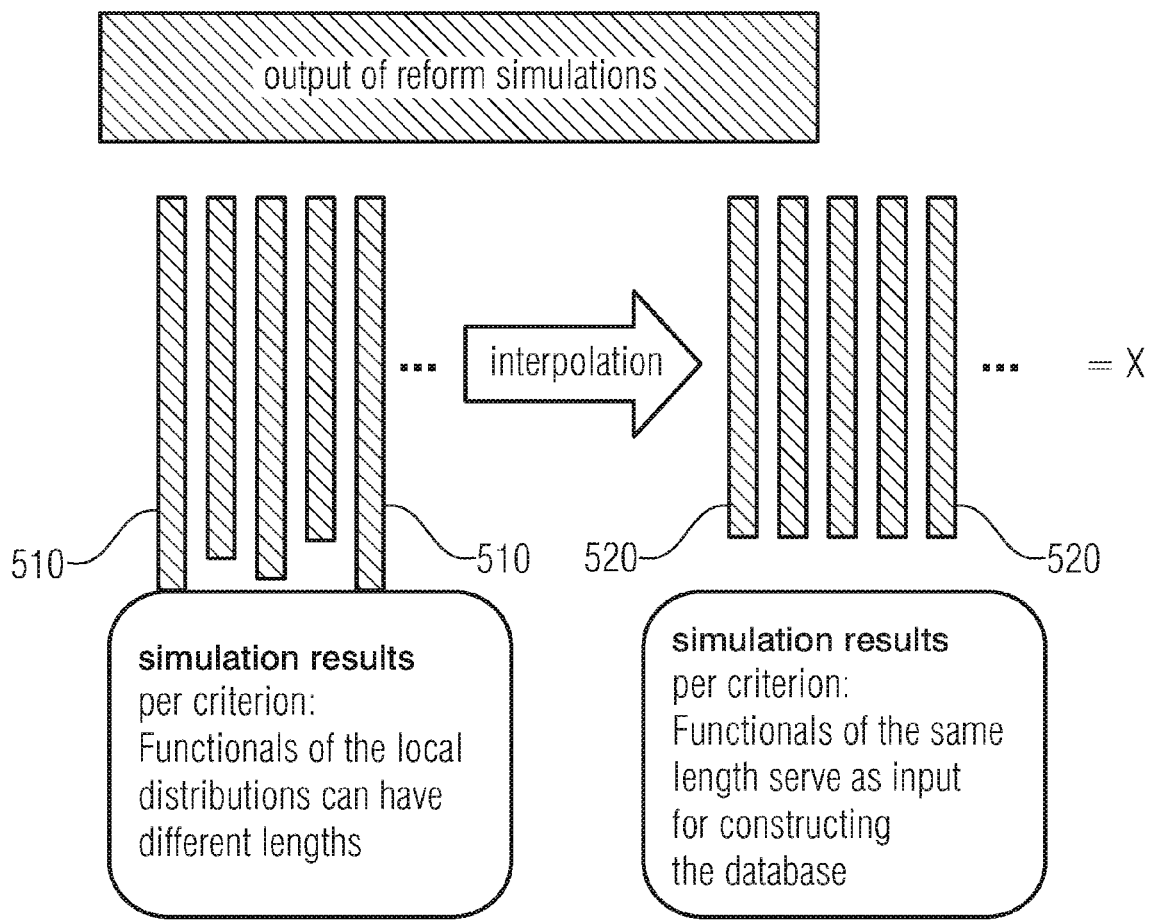
FIG. 5 is a schematic illustration of an adaptation of process simulation data.

When considering different process parameter values, at the end of a process simulation, despite initially used identical simulation grids, different final simulation grids can result, on which the process simulation data are based, since a process simulator can refine the initial simulation grid differently during the process simulation, depending on the course of the simulation. These possibly different simulation grids can be returned again to a common reference grid by the described process simulation data adapter. FIG. 5 shows a schematic example of an output of a forming simulation. As a simulation result, per criterion, functionals 510 of the local distributions can have different lengths (can be based on simulation grids of different sizes). The same can be matched to one another by interpolation, so that as a simulation result per criterion functionals 520 of the same length can serve as input for constructing the database (e.g. a process simulation data matrix X).

Since the process simulation data adapter 350 is similar to the above-described process simulation database converter 230, the same can also be implemented as one unit fulfilling both tasks.

Generally, the process parameter classifier 110, the process simulation data processor 120, the process simulator 230, the process simulation database converter 240 or the process simulation database adapter 350 can, for example, be independent hardware units or part of a process, microcontroller or computer as well as computer programs or software products for execution on a processor, microcontroller or computer.

Further, the process underlying the process simulations can generally be, for example, a production process, a handling process, a processing process, a converting process or a forming process.

In the following, the inventive concept will be illustrated again in a detailed example showing many of the above-mentioned aspects of the invention in an application.

Here, a method is described where, firstly, based on a parameterized simulation model, several designs of a process step (a process) are simulated, wherein each design is determined by a set of values of the design parameters (process parameters). The individual designs, i.e. the sets of values of the design parameters, are selected, for example, according to a design of experiment or an iteratively extended design of experiment.

Secondly, for the database resulting in this way from simulation results—consisting of function values of several possibly time-dependent functions living on possibly high-resolution simulation grids—the variations to be mapped, which represent local quantities on the grid, are interpolated or approximated as well as compressed.

Thirdly, the mapping (the transfer) of the database constructed in this way including a quality check by means of a loss of accuracy with respect to the quantity of the variations based on parameter variations to the grid (or also several grids) takes place for the next process step (follow-up processes) that might possibly be resolved differently and in a geometrically varying way due to trimming or the same. The steps will be discussed in more detail below.

As design of experiment, for example, methods of random sampling, Latin hypercube, fractional or full factorial design, etc. can be used but are not limited thereto. The design region (region in which the process parameters are varied) is determined by an output design corresponding to the process without variation of parameters and the upper and lower limits per parameter to be examined. Sub-regions can be stated that are to be excluded. Per parameter, a distribution function can be stated for its region, for example Gaussian, equal or Weibull distribution. The same can be obtained, for example, from physical experiments or theoretical considerations.

As long as the simulation results do not already exist on the same grid, the same can be interpolated or approximated on one or several reference grids (e.g. by a process simulation data adapter). A reference grid can, for example, be the last grid of the output design or another design resulting in the simulation. If the same includes local refinements, they can be used or also be removed beforehand. For interpolation, the same method can be used as for mapping (method for transferring the process simulation database to a follow-up process).

Interpolation of the variations of the simulation results can be performed per reference grid (e.g. one for each simulated value, such as sheet thickness, tension . . . ), for example, by means of a method of base transformation, which includes, for example, singular value decomposition as well as core-based methods. Singular value decomposition of the matrix X is represented by $X=UWV^T$ and consists of the respective, possibly interpolated simulation results. In this case, the resulting coefficients are subsequently interpolated or approximated in V. Here, as far as known, distribution functions for the parameter variations can be included and mapped via interpolation or approximation.

For interpolation or approximation (for determining the functionals or derived functionals of new process parameter values for a process parameter or a plurality of process parameters) many known methods are available, e.g. methods of the classes meta modeling, response surface model, (non-linear) regression, radial basis functions (RBF), Kriging, wavelets, self-organizing maps (SOM), support vector machines (SVM) or neural networks.

For compressing (or reducing) the database of simulation results, for example, the result of the base transformation can be used directly. Here, the user can determine, by a tolerance barrier, with what accuracy the information from all parameter variations is to be maintained. In addition, the user can state a mathematically defined norm that is to be used for error calculation. Here, he can, for example, weigh non-interesting regions of the grid less to put the emphasis on the interesting regions. For example in the case of singular value decomposition, the resulting error can be calculated by means of the Parseval criterion. Compression is then performed more accurately by setting the singular values $w_1$ to zero, starting from a number k+1, the singular values $w_1$ being represented by the diagonal elements of the matrix W. The resulting reconstruction of the matrix X includes a derivative dX of X. The accuracy of this reconstruction can be controlled by k, the $L_2$ norm of this derivative is $$err^2 = \sum_{ij} dx_{ij}^2 = \sum_{l=k+1}^{N} w_l^2,$$

i.e. the sum of the squares of the omitted singular values. Thereby, an accuracy criterion can be defined. Normally, the singular values decrease quickly with k, so that only a few values (e.g. only 3-7 values of 25 process simulations or approx. 10-30% of the number of process simulations) have to be maintained to obtain suitable accuracy. In the case of singular value decomposition, decomposition and compression can take place simultaneously, so that all in all only the first k components have to be calculated directly.

The essential step of the method is to prepare the database such that the completely local mapping of all variation information to the next process step is enabled efficiently with respect to the number of necessitated simulations and computing time for the method itself. This preparation can be divided, for example, in two cases. In the first case, the parameter variations have a linear or only weakly non-linear effect on the simulation results, in the second case in a more non-linear. The measure of non-linearity can be determined, for example, via a method for sensitivity analysis for the effect of parameter variations on the simulation results. For this, for example, Taylor series approximations can be used. More specifically, for example, approximations are calculated for the Jacobian matrix J and the Hessian H, $$J_{ik} = \partial x_i / \partial par_k H_{jk}^{(i)} = \partial^2 x_i / (\partial par_j \partial par_k).$$

Here, the result of the base transformation can also be used directly, in the case of the singular value decomposition, the coefficients in V are considered.

As estimator for the degree of non-linearity, the following measure can be used, if the Hessian is zero or almost zero, the behavior is to be considered as linear or weakly non-linear. If the following applies:

$$J^{(i)} < \frac{D}{4} H_{max}^{(i)},$$

the behavior is to be considered as non-linear. Here, $$J^{(i)} = \sqrt{\sum_j J_{ij}^2},$$

D is the diameter of the region where the parameters have been varied and $H_{max}^{(i)}$ the maximum absolute eigenvalue of $H_{jk}^{(i)}$. By a sensitivity analysis, additionally, those parameters can be determined whose variations show no relevant effects for the user and hence do not have to be examined any further.

Thus, the method can run such that first those parameters are determined whose variations have a linear or weakly non-linear effect to a relevant extent. For these parameters, a simple interpolation or approximation method can be used for the resulting variations of the simulation results. For parameters whose variations have a stronger non-linear effect to a relevant extent, more complex interpolation or approximation methods with more supporting points, i.e. simulations, can be used. The missing stimulations are performed additionally, i.e. the design of experiment is iteratively extended. For example, for these parameters, a common design of experiment can be used for determining supporting points. Additionally, methods can be used that divide the simulation region according to defined criteria, for example according to the influence of a specific quantity or of maximum or minimum quantities. The interpolation or approximation method is then decided upon per sub-region. Then, a constant transition between the sub-regions should be provided, e.g. by the use of decay functions.

Mapping (transferring the processed process simulation database to a follow-up process) can be performed by any interpolation or approximation method. However, the quality of the mapping should be examined by a quality check. Errors c additionally introduced by the mapping should—at least in the regions of the grid relevant for the user—be significantly smaller than variations a that have resulted from the parameter variations to obtain significant statistical statements for the subsequent process step(s).

A coarse (global) estimation of variations or the simple assumption of a statistical distribution of a quantity on the grid as input quantity for the next process step that is mostly inaccurate and does not correspond to reality results in errors and an inaccurate to wrong estimation of the resulting variations.

The invention, however, enables to follow the effect of design parameter variations (process parameter variation) across the history of the process and to quantify and analyze the same, in particular for the last process step. The variations resulting at the beginning of the process can be carried over across the entire process. Thereby, the development engineer can analyze the effects of variations for parts or also the entirety of the production or operational process, and thereby receives an impression for the entire process chain and a starting point for changing design parameters for obtaining a result that is robust to parameter variations. With the help of this invention, by considering the history of the process and its parameter variations, the quality of the simulations and, by a subsequent robust optimization, the quality of the overall process can be significantly improved.

The inventive concept can be used, or applied, for example in the field of numerical simulation of production and operational processes, as far as changes of an output design to be examined can be parameterized. Fields of application are, in particular, but not only, process chains in the automotive industry, such as forming crash, forming NVH (noise, vibration, harshness), forming statics, casting crash, casting NVH, casting statics, etc., as well as multiple-step forming processes, and the chain semiconductor-process-device-circuit simulation in microelectronics. Additionally, all process chains can be used where a scientific-technical process is simulated in several steps, where the product, in these steps, is defined via design parameters on grids that might have a high resolution. The necessitated data can in each case be provided by numerical simulation and reading in the simulation results.

Figure 6:
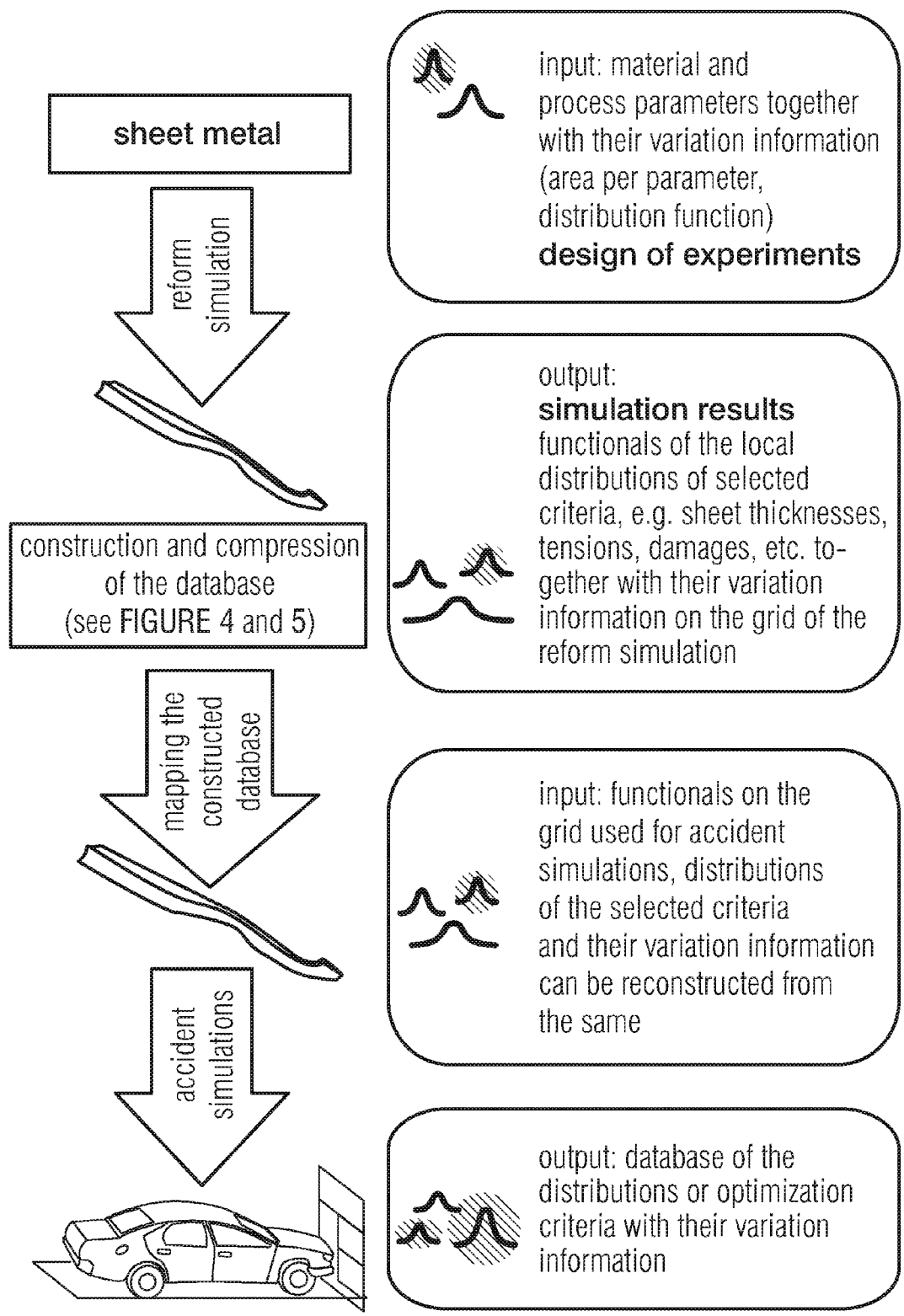
FIG. 6 is a schematic course of the method based on the example of a process chain forming-crash.

The inventive concept will be discussed in more detail below based on an embodiment with reference to FIGS. 4 to 6. In FIG. 6, the course of the method is illustrated schematically based on the example of the process chain forming crash for the main sheet metal shell of a B pillar. The crash step is indicated only symbolically. FIGS. 4 and 5 represent the step of constructing the database in more detail, exemplarily for the case that singular value decomposition is used.

Different material and process parameters are determined as input, for example 15 pieces, together with the allowable variation range or a distribution function per parameter. In the following forming simulations, the values of the parameters are varied according to a design of experiment. In FIG. 6, a sheet metal is formed into a member of a vehicle. The local distributions of specific criteria, in this case local sheet metal thicknesses, tensions and damages, are obtained as an output of this first process step, together with local variations caused by these parameter variations on the grids resulting in the forming simulations that are locally refined in different ways. This database is now analyzed, possibly reduced or compressed. The relevant data for the transfer to the next process step crash are made up in this example of the constructed database, including functionals, by means of which local distributions of the sheet metal thickness, plastic elongations and damages can be reconstructed together with their interpolated local variations.

Then, mapping of this newly constructed database to the grid of the next process step is performed, in this example a crash simulation based on a significantly coarser and trimmed grid. This mapping step of variation means that now the values for sheet thicknesses, tensions and damages, together with their respective variation band (or their variation distribution), are provided as input locally on the crash grid, i.e. at each node point. In the second process step, consistent simulations are performed, local or global criteria can be defined as output, but especially the complete variation information is available for the simulation results defined on the crash grid(s). A comparison of different scenarios, also with results of physical experiments, shows in this example both the quality of the crash simulation results due to adding the history from the forming simulation including finely resolved variations and in particular the high influence of the variation in the critical regions (crack and break zones) of the formed sheet metal part in the crash experiment.

Figure 7:
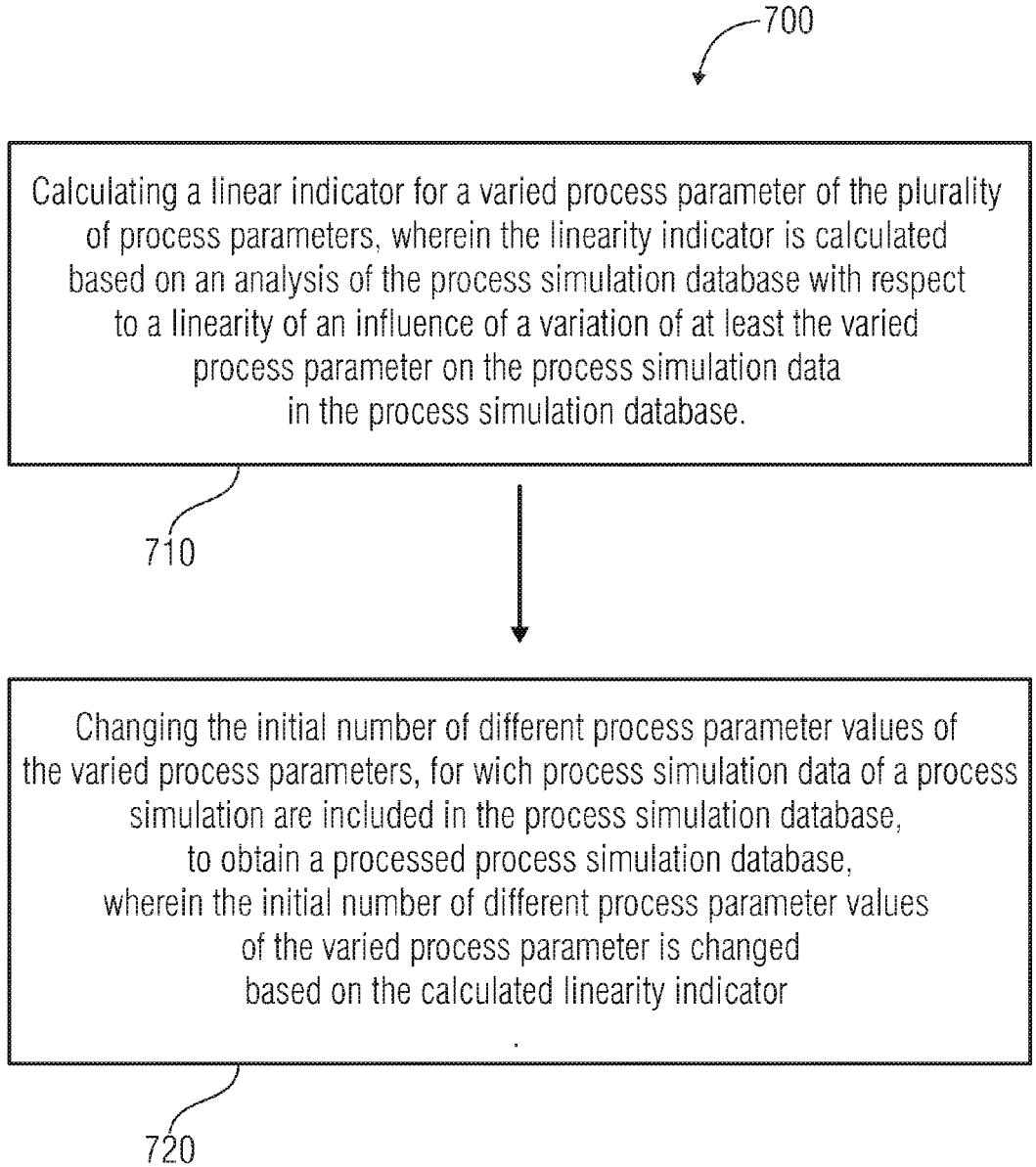
FIG. 7 is a flow diagram of a method for processing a process simulation database of a process.

FIG. 7 shows a flow diagram of a method 700 for processing a process simulation database of a process according to an embodiment of the invention. The process simulation database of the process comprises process simulation data of a plurality of process simulations, wherein each process simulation of the plurality of process simulations is based on a different variation of a plurality of process parameters. For each process parameter of the plurality of process parameters, for an initial number of different process parameter values, process simulation data of a process simulation are included in the process simulation database. The method 700 comprises calculating 710 a linearity indicator for a varied process parameter of the plurality of process parameters, and changing 720 the initial number of different process parameter values of the varied process parameter. Thereby, the calculation 710 of the linearity indicator is performed for the varied process parameter of the plurality of process parameters based on an analysis of the process simulation database with respect to a linearity of an influence of a variation of at least the varied process parameter on the process simulation data in the process simulation database. Further, changing 720 the initial number of different process parameter values of the varied process parameter, for which process simulation data of a process simulation are included in the process simulation database, is performed based on the calculated linearity indicator to obtain a processed process simulation database.

Optionally, the method 700 can be extended by additional steps corresponding to the above-described aspect of the inventive concept.

Some embodiments of the invention relate to a method for variation mapping, resulting from design parameter variations (process parameter variations) between individual process steps (processes) of process chains.

The present invention relates, among other things, to a method for local variation mapping, resulting from design parameter variations, between the individual process steps of entire process chains. More generally, the invention relates to a method for local mapping of variations of discrete functions to highly resolved grids between two process steps on possibly different grids; this method can be applied repeatedly in succession and hence relates to entire process chains of two or more steps.

The inventive concept can realize a method by which the effect of variations of design parameters can be analyzed across the entire history of a production or operational process, i.e. across several process steps towards the end result.

For this, for example by the invention, a method for variation mapping for entire process chains is suggested, where—exemplarily for, but not limited to, a chain consisting of two process steps—the transfer between the two process steps is performed, both for the case that the design parameter variations have a linear effect and for the case that the same have a non-linear effect on the end product.

Several further embodiments according to the invention relate to a method for stochastic analysis of entire process chains and in particular to the mapping of local variations to possible highly resolved simulation grids resulting from design parameter variations between the individual process steps of entire process chains where, based on a parameterized simulation model, several processes of the first process step are simulated, for the resulting database of simulation results the variations to be mapped, which represent local quantities on the respective simulation grid, are prepared, i.e. interpolated or approximated and, if necessitated, also compressed, the preparation, if divided into two cases, being performed in the case of linear or weakly non-linear effects of individual parameter variations for the same by an interpolation or approximation method, such as a singular value decomposition with few supporting points, the preparation being performed generally, or, if divided into two cases, in the case of stronger non-linear effects of individual parameter variations for the same by an interpolation or approximation method, such as a singular value decomposition of simulation results, based on a common design of experiment for the parameters with subsequent, more complex interpolation of the coefficients, the mapping of this database including a quality check being performed with respect to a loss of accuracy with respect to the quantity of the variations due to parameter variations on the grid(s) to be used at the start of the next process step.

Here, the processes can each include a variation of a design parameter and the individual processes can be selected according to any design of experiment. The design parameter variations can have a linear or also non-linear effect on the end product.

According to an aspect of the invention, the design parameter variations can be mapped locally on the entire relevant grid to the next process step. Mapping can be performed between grids possibly having different resolution or geometry, e.g. due to trimming.

The design parameter variations can be transferred locally across several steps and hence the history of entire process chains can be considered in the final process step.

The grid can be divided into different regions according to defined criteria (e.g. according to the influence of a specific quantity) and the interpolation or approximation of the variations can take place locally per region, possibly with constant or constantly differentiable transitions between the sub-regions.

While some aspects have been described in the context of an apparatus, it is obvious that these aspects also represent a description of the respective method, so that a block or a component of an apparatus can also be considered as a respective method step or feature of a method step. Analogously, aspects that have been described in the context of a method step or as a method step also represent a description of a respective block or detail or feature of a respective apparatus.

Depending on the implementation requirements, embodiments of the invention can be implemented in hardware or in software. The implementation can be performed using a digital memory medium, for example a floppy disc, a DVD, a Blu-ray disc, a CD, an ROM, a PROM, an EPROM, an EEPROM of a FLASH memory, a hard drive or any other magnetic or optical memory on which electronically readable control signals are stored that can cooperate or cooperate with a programmable computer system such that the respective method is performed. Thus, the digital memory medium can be computer-readable. Some embodiments according to the invention also include a data carrier comprising electronically readable control signals that are able to cooperate with a programmable computer system such that one of the methods described herein is performed.

Generally, embodiments of the present invention can be implemented as a computer program product having a program code, wherein the program code is effective for performing one of the methods when the computer program product runs on a computer. The program code can, for example, also be stored on a machine-readable carrier.

Other embodiments comprise the computer program for performing one of the methods described herein, wherein the computer program is stored on a machine-readable carrier.

In other words, an embodiment of the inventive method is a computer program comprising a program code for performing one of the methods described herein when the computer program runs on a computer. A further embodiment of the inventive method is a data carrier (or a digital memory medium or a computer-readable medium) on which the computer program for performing one of the methods described herein is recorded.

A further embodiment of the inventive method is a data stream or a sequence of signals representing the computer program for performing one of the methods described herein. The data stream or the sequence of signals can be configured, for example, in that the same can be transferred via a data communication connection, for example via the internet.

A further embodiment comprises a processing means, for example a computer or a programmable logic device that is configured or adapted to perform one of the methods described herein.

A further embodiment comprises a computer on which the computer program for performing one of the methods described herein is installed.

In some embodiments, a programmable logic device (for example a field-programmable gate array, an FPGA) can be used to perform some or all functionalities of the method described herein. In some embodiments, a field-programmable gate array can cooperate with a microprocessor to perform one of the methods described herein. Generally, the methods are performed in some embodiments by means of any hardware device. The same can be universally usable hardware, such as a computer processor (CPU) or hardware specific for the method, such as an ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for processing a process simulation database of a process, comprising process simulation data of a plurality of process simulations of the process, wherein each process simulation of the plurality of process simulations is based on a different variation of a plurality of process parameters, wherein for each process parameter of the plurality of process parameters, for an initial number of different process parameter values, process simulation data of a process simulation are comprised in the process simulation database, comprising:

at least one computer processor;

a process parameter classifier that is implemented to calculate a linearity indicator for a varied process parameter of the plurality of process parameters based on an analysis of the process simulation database with respect to a linearity of an influence of a variation of at least the varied process parameter on the process simulation data in the process simulation database, wherein the process parameter classifier is implemented to calculate, for the varied process parameter, an influence intensity indicator based on an analysis of the process simulation database with respect to intensity of an influence of a variation at least of the varied process parameter on the process simulation data in the process simulation database, and is implemented to allocate the varied process parameter to a first influence-dependent class of process parameters, when the influence intensity indicator fulfills a minimum influence criterion, or to allocate the varied process parameter to a second influence-dependent class of process parameters when the influence intensity indicator does not fulfill the minimum influence criterion, wherein a process parameter that is allocated to the first influence-dependent class of process parameters has a stronger influence on the process simulation data in the process simulation database than a process parameter that is allocated to the second influence-dependent class of process parameters; and a process simulation data processor that is implemented to change the initial number of different process parameter values of the varied process parameter, for which process simulation data of a process simulation are comprised in the process simulation database, based on the calculated linearity indicator to acquire a processed process simulation database.

2. The apparatus according to claim 1, wherein the process parameter classifier is implemented to allocate the varied process parameter to a first linearity-dependent class of process parameters when a calculated linearity indicator of the varied process parameter fulfills a predefined non-linearity criterion, or the process parameter classifier is implemented to allocate the varied process parameter to a second linearity-dependent class of process parameters when the calculated linearity indicator of the varied process parameter does not fulfill the predefined non-linearity criterion, wherein a process parameter that is allocated to the first linearity-dependent class of process parameters has a stronger non-linear influence on the process simulation data in the process simulation database than a process parameter that is allocated to the second linearity-dependent class of process parameters.

3. The apparatus according to claim 2, wherein the process simulation data processor is implemented to change the initial number of different process parameter values of the varied process parameter such that a changed number of different process parameter values of the varied process parameter is smaller when the varied process parameter is allocated to the second linearity-dependent class of process parameters than a changed number of different process parameter values of the varied process parameter when the varied process parameter is allocated to the first linearity-dependent class of process parameters.

4. The apparatus according to claim 1, wherein the process simulation data processor is implemented to change the initial number of different process parameter values of the varied process parameter such that a changed number of different process parameter values of the varied process parameter is smaller when the varied process parameter is allocated to the second influence-dependent class of process parameters than a changed number of different process parameter values of the varied process parameter when the varied process parameter is allocated to the first influence-dependent class of process parameters.

5. The apparatus according to claim 1, wherein the process parameter classifier is implemented to allocate, at first, the varied process parameter to the first linearity-dependent class or the second linearity-dependent class and then the varied process parameter to the first influence-dependent class or the second influence-dependent class, when the varied process parameter has first been allocated to the second linearity-dependent class.

6. The apparatus according to claim 5, wherein the process simulation data processor is implemented to reduce the initial number of different process parameter values of the varied process parameter to two different process parameter values of the varied process parameter, for which process simulation data of a process simulation are comprised in the process simulation database, when the varied process parameter is allocated to the second linearity-dependent class of process parameters and the first influence-dependent class of process parameters, or the process simulation data processor is implemented to reduce the initial number of different process parameter values of the varied process parameter to a single process parameter value of the varied process parameter, for which process simulation data of a process simulation are comprised in the process simulation database, when the varied process parameter is allocated to the second linearity-dependent class and the second influence-dependent class.

7. The apparatus according to claim 1, wherein the process parameter classifier is implemented to calculate the linearity indicator of the varied process parameter based on a core-based method or based on a singular value decomposition of a process simulation data matrix, wherein the process simulation data matrix represents the process simulation database.

8. The apparatus according to claim 1, wherein the process parameter classifier is implemented to calculate the linearity indicator of the varied process parameter based on a sensitivity analysis of the process simulation database under variation of the process parameters of the plurality of process parameters.

9. The apparatus according to claim 1, wherein the process simulation data processor is implemented to reduce or compress the process simulation database based on neglecting diagonal elements of a diagonal matrix of the singular value decomposition.

10. The apparatus according to claim 1, wherein the process parameter classifier is implemented to calculate the linearity indicator of the varied process parameter based on a Hessian, wherein the Hessian indicates a measure for the second-order partial derivative of the process simulation data under variation of the plurality of process parameters.

11. The apparatus according to claim 10, wherein the process parameter classifier is implemented to calculate a Jacobian matrix, wherein the Jacobian matrix indicates a measure for the first derivative of the process simulation data under variation of the plurality of process parameters, wherein the process parameter classifier is implemented to allocate the varied process parameter, based on a comparison of a comparison parameter based on the Jacobian matrix with the linearity indicator based on the Hessian, to the first linearity-dependent class of process parameters or to the second linearity-dependent class of process parameters.

12. The apparatus according to claim 11, wherein the process parameter classifier is implemented to calculate a linearity indicator based on a maximum eigenvalue of the Hessian and to compare the same to a comparison parameter based on the Jacobian matrix, to allocate all process parameters of the plurality of process parameters to the second linearity-dependent class of process parameters when a non-linearity criterion is not fulfilled.

13. The apparatus according to claim 12, wherein the process parameter classifier is implemented to calculate a linearity indicator for each eigenvalue of the Hessian and to compare the same to a comparison parameter based on the Jacobian matrix and to determine an eigenvalue for which the allocated linearity indicator fulfills a non-linearity criterion, to determine a subset of varied process parameters of the plurality of process parameters of which at least one process parameter of the subset of varied process parameters is to be allocated to the first linearity-dependent class.

14. The apparatus according to claim 13, wherein the process parameter classifier is implemented to calculate, for each process parameter of the subset of varied process parameters, an eigenvector with associated eigenvalue such that each eigenvector depends in each case only on one process parameter of the subset of varied process parameters and is independent of the other process parameters of the subset of process parameters, and is implemented to calculate, for each eigenvalue of the eigenvectors, a linearity indicator based on the respective eigenvalue and to compare the same to a comparison parameter based on the Jacobian matrix, to determine an eigenvalue for which a non-linearity criterion is fulfilled and to allocate the associated process parameter to the first linearity-dependent class of process parameters.

15. The apparatus according to claim 9, wherein the process parameter classifier is implemented to calculate a Jacobian matrix, wherein the Jacobian matrix indicates a measure for the first derivative of the process simulation data under variation of the plurality of process parameters, to allocate the varied process parameter, based on a comparison of the influence intensity indicator with a comparison parameter based on a column of the Jacobian matrix, to the first influence-dependent class of process parameters or to the second influence-dependent class of process parameters, wherein the influence intensity indicator is based on a column of the Jacobian matrix indicating a measure for the first derivative of process simulation data under variation of the varied process parameter.

16. The apparatus according to claim 1, wherein the process parameter classifier is implemented to calculate a linearity indicator or an influence intensity indicator for each process parameter of the plurality of process parameters.

17. The apparatus according to claim 1, comprising a process simulator that is implemented to simulate the process for a combination of process parameter values of the plurality of process parameters in order to acquire process simulation data for the combination of process parameter values and to add the same to the process simulation database.

18. The apparatus according to claim 15, wherein the process simulation data processor is implemented to determine two different process parameter values for the varied process parameter when the varied process parameter is allocated to the second linearity-dependent class of process parameters and the first influence-dependent class of process parameters, and wherein the process simulator is implemented to generate, for the two determined process parameter values of the varied process parameter in combination with a variation of the residual process parameters of the plurality of process parameters, new process simulation data, and to replace the old process simulation data in the process simulation database by the new process simulation data.

19. The apparatus according to claim 17, wherein the process simulation data processor is implemented to determine at least three process parameter values for the varied process parameter when the varied process parameter is allocated to the first linearity-dependent class, wherein at least one determined process parameter value is not already comprised in the initial number of process parameter values of the varied process parameter, and wherein the process simulator is implemented to generate, for all determined process parameter values that are not already comprised in the initial number of process parameter values of the varied process parameter, in combination with a variation of the residual process parameters of the plurality of process parameters, new process simulation data and to add the same to the process simulation database, and wherein the process simulation data processor is implemented to remove process simulation data of process parameter values that have not been determined by the process simulation data processor from the process simulation database.

20. The apparatus according to claim 17, wherein the process simulation data processor is implemented to interpolate or approximate the results for a varied process parameter value or a plurality of varied process parameter values based on meta modeling, a response area model, non-linear regression, radial base functions, Kriging, wavelets, self-organizing maps, support vector machines or neural networks.

21. The apparatus according to claim 17, wherein the process simulator is implemented to generate the process simulation data of the process simulation database for the different variations of the plurality of process parameters, wherein the plurality of process parameters are varied based on a design of experiment.

22. The apparatus according to claim 1, comprising a process simulation data adapter that is implemented to map process simulation data of different process simulations of the plurality of process simulations that are based on different simulation grids to a common reference grid.

23. The apparatus according to claim 1, wherein the process underlying the process simulations is a production process, a manufacturing process, a processing process, a handling process, a conversion process or a forming process.

24. The apparatus according to claim 1, comprising a process simulation database converter that is implemented to map the processed process simulation database to a simulation grid for process simulation of a follow-up process in order to generate the process simulation database for the process simulation of the follow-up process, wherein the simulation grid depends on the follow-up process.

25. The apparatus according to claim 24, wherein the process simulation database converter is implemented to calculate a quality parameter, wherein the quality parameter is a measure for an error of the mapping of the processed process simulation database to the simulation grid of the process simulation of the follow-up process, wherein the process simulation database converter is implemented to map the processed process simulation database such that the quality parameter is smaller than a maximum variation of process simulation data in the processed process simulation database under variation of the plurality of process parameters.

26. An apparatus for processing a process simulation database of a process, comprising process simulation data of a plurality of process simulations of the process, wherein each process simulation of the plurality of process simulations is based on a different variation of a plurality of process parameters, wherein for each process parameter of the plurality of process parameters, for an initial number of different process parameter values, process simulation data of a process simulation are comprised in the process simulation database, comprising:

at least one computer processor;
a process parameter classifier that is implemented to calculate a linearity indicator for a varied process parameter of the plurality of process parameters based on an analysis of the process simulation database with respect to a linearity of an influence of a variation of at least the varied process parameter on the process simulation data in the process simulation database, wherein the process parameter classifier is implemented to calculate, for the varied process parameter, an influence intensity indicator based on an analysis of the process simulation database with respect to intensity of an influence of a variation at least of the varied process parameter on the process simulation data in the process simulation database, and is implemented to allocate the varied process parameter to a first influence-dependent class of process parameters, when the influence intensity indicator fulfills a minimum influence criterion, or to allocate the varied process parameter to a second influence-dependent class of process parameters when the influence intensity indicator does not fulfill the minimum influence criterion, wherein a process parameter that is allocated to the first influence-dependent class of process parameters has a stronger influence on the process simulation data in the process simulation database than a process parameter that is allocated to the second influence-dependent class of process parameters; a process simulation data processor that is implemented to change the initial number of different process parameter values of the varied process parameter, for which process simulation data of a process simulation are comprised in the process simulation database, based on the calculated linearity indicator to acquire a processed process simulation database, that is implemented to process the process simulation database of the process generated by the process simulator; and a process simulation database converter that is implemented to map the processed process simulation database to a simulation grid for process simulation of a follow-up process to generate the process simulation database for the process simulation of the follow-up process, wherein the simulation grid depends on the follow-up process.

27. A method for processing a process simulation database of a process comprising process simulation data of a plurality of process simulations of the process, wherein each process simulation or the plurality of process simulations is based on a different variation of a plurality of process parameters, wherein, for each process parameter of the plurality of process parameters, for an initial number of different process parameter values, process simulation data of the process simulation are comprised in the process simulation database, comprising:

calculating, using a processor, a linearity indicator for a varied process parameter of the plurality of process parameters, wherein the linearity indicator is calculated based on an analysis of the process simulation database with respect to a linearity of an influence of a variation of at least the varied process parameter on the process simulation data in the process simulation database, using a process parameter classifier, wherein the process parameter classifier is implemented to calculate, for the varied process parameter, an influence intensity indicator based on an analysis of the process simulation database with respect to intensity of an influence of a variation at least of the varied process parameter on the process simulation data in the process simulation database, and is implemented to allocate the varied process parameter to a first influence-dependent class of process parameters, when the influence intensity indicator fulfills a minimum influence criterion, or to allocate the varied process parameter to a second influence-dependent class of process parameters when the influence intensity indicator does not fulfill the minimum influence criterion, wherein a process parameter that is allocated to the first influence-dependent class of process parameters has a stronger influence on the process simulation data in the process simulation database than a process parameter that is allocated to the second influence-dependent class of process parameters; and changing, using the processor, the initial number of different process parameter values of the varied process parameter, for which process simulation data of a process simulation are comprised in the process simulation database, to acquire a processed process simulation database, wherein the initial number of different process parameter values of the varied process parameter is changed based on the calculated linearity indicator.

28. A non-transitory computer readable medium including a computer program comprising a program code for performing a method, when the computer program runs on a computer or a microcontroller, for processing a process simulation database of a process comprising process simulation data of a plurality of process simulations of the process, wherein each process simulation or the plurality of process simulations is based on a different variation of a plurality of process parameters, wherein, for each process parameter of the plurality of process parameters, for an initial number of different process parameter values, process simulation data of the process simulation are comprised in the process simulation database, the method comprising:

calculating a linearity indicator for a varied process parameter of the plurality of process parameters, wherein the linearity indicator is calculated based on an analysis of the process simulation database with respect to a linearity of an influence of a variation of at least the varied process parameter on the process simulation data in the process simulation database, using a process parameter classifier, wherein the process parameter classifier is implemented to calculate, for the varied process parameter, an influence intensity indicator based on an analysis of the process simulation database with respect to intensity of an influence of a variation at least of the varied process parameter on the process simulation data in the process simulation database, and is implemented to allocate the varied process parameter to a first influence-dependent class of process parameters, when the influence intensity indicator fulfills a minimum influence criterion, or to allocate the varied process parameter to a second influence-dependent class of process parameters when the influence intensity indicator does not fulfill the minimum influence criterion, wherein a process parameter that is allocated to the first influence-dependent class of process parameters has a stronger influence on the process simulation data in the process simulation database than a process parameter that is allocated to the second influence-dependent class of process parameters; and changing the initial number of different process parameter values of the varied process parameter, for which process simulation data of a process simulation are comprised in the process simulation database, to acquire a processed process simulation database, wherein the initial number of different process parameter values of the varied process parameter is changed based on the calculated linearity indicator.

* * * * *